United States Patent
Kang et al.

(10) Patent No.: US 11,302,555 B2
(45) Date of Patent: Apr. 12, 2022

(54) SUBSTRATE PROCESSING APPARATUS, INFORMATION PROCESSING APPARATUS, AND SUBSTRATE PROCESSING METHOD

(71) Applicant: Tokyo Electron Limited, Tokyo (JP)

(72) Inventors: Youngtai Kang, Yamanashi (JP); Yuichi Takenaga, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 16/926,909

(22) Filed: Jul. 13, 2020

(65) Prior Publication Data
US 2021/0020487 A1   Jan. 21, 2021

(30) Foreign Application Priority Data
Jul. 17, 2019 (JP) .............................. JP2019-132260

(51) Int. Cl.
| | |
|---|---|
| *H01L 21/68* | (2006.01) |
| *H01L 21/673* | (2006.01) |
| *H01L 21/66* | (2006.01) |
| *H01L 21/67* | (2006.01) |
| *H01L 21/677* | (2006.01) |

(52) U.S. Cl.
CPC ........ *H01L 21/68* (2013.01); *H01L 21/67253* (2013.01); *H01L 21/67303* (2013.01); *H01L 21/67757* (2013.01); *H01L 22/20* (2013.01)

(58) Field of Classification Search
CPC ......... H01L 21/67253; H01L 21/67303; H01L 21/67757; H01L 21/67778; H01L 21/68; H01L 22/12; H01L 22/20
See application file for complete search history.

(56) References Cited

U.S. PATENT DOCUMENTS

| | | | | |
|---|---|---|---|---|
| 6,630,995 B1 * | 10/2003 | Hunter | .............. | G01N 21/94 |
| | | | | 356/237.2 |
| 9,104,196 B2 * | 8/2015 | Koyama | ......... | G05B 19/41875 |
| 2004/0159284 A1 * | 8/2004 | Sakamoto | ......... | H01L 21/67259 |
| | | | | 118/712 |

(Continued)

FOREIGN PATENT DOCUMENTS

JP        2012-094814 A        5/2012

*Primary Examiner* — Mohammed Shamsuzzaman
(74) *Attorney, Agent, or Firm* — Abelman, Frayne & Schwab

(57) ABSTRACT

A substrate processing apparatus includes a substrate transfer device that transfers a substrate accommodated in a substrate transfer container to a substrate holder; a substrate holder transfer stage that introduces the substrate holder into a reaction container; a substrate transfer controller that obtains a film thickness measurement result of the substrate, and determines a placing position of the substrate in the substrate holder by a model created in advance from the film thickness measurement result and a transfer position setting circuit; an information processing circuit that analyzes an eccentricity state from a film thickness variation state when a film thickness measurement result is newly obtained; a learning function circuit that updates the model from the eccentricity state; and an optimization function circuit that updates the placing position of the substrate by an updated model and the transfer position setting circuit.

5 Claims, 15 Drawing Sheets

(56) References Cited

U.S. PATENT DOCUMENTS

| | | | |
|---|---|---|---|
| 2006/0011133 A1* | 1/2006 | Nishibayashi | H01L 21/6719 118/630 |
| 2008/0294280 A1* | 11/2008 | Okita | G03F 7/70625 700/108 |
| 2015/0017880 A1* | 1/2015 | Nomura | G01B 11/0633 451/5 |
| 2016/0211157 A1* | 7/2016 | Inoshima | H01L 21/67276 |
| 2021/0134570 A1* | 5/2021 | Yamazaki | G05B 19/4155 |

* cited by examiner

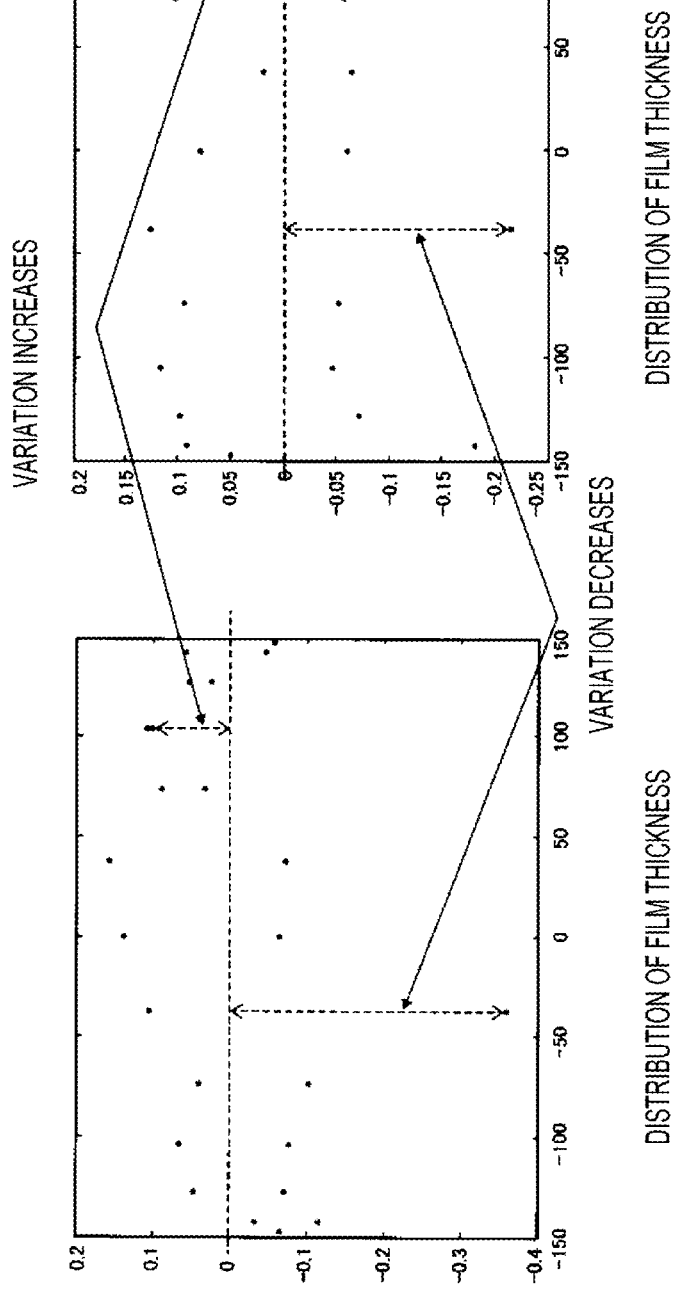

FIG. 11

| MEASUREMENT POINT NUMBER | FILM THICKNESS [Å] OF MONITOR WAFER(M1) | FILM THICKNESS [Å] OF MONITOR WAFER(M2) | FILM THICKNESS [Å] OF MONITOR WAFER(M3) | FILM THICKNESS [Å] OF MONITOR WAFER(M4) | FILM THICKNESS [Å] OF MONITOR WAFER(M5) |
|---|---|---|---|---|---|
| 1 | FILM THICKNESS VALUE M1_1 | FILM THICKNESS VALUE M2_1 | FILM THICKNESS VALUE M3_1 | FILM THICKNESS VALUE M4_1 | FILM THICKNESS VALUE M5_1 |
| .. | .. | .. | .. | .. | .. |
| 24 | FILM THICKNESS VALUE M1_24 | FILM THICKNESS VALUE M2_24 | FILM THICKNESS VALUE M3_24 | FILM THICKNESS VALUE M4_24 | FILM THICKNESS VALUE M5_24 |

FIG. 12

| TP | TOP RT[°] | TOP FB[mm] | ... | BTM RT[°] | BTM FB[mm] |
|---|---|---|---|---|---|
| CURRENT Run | TP VALUE TOPRT | TP VALUE TOPFB | ... | TP VALUE BTMRT | TP VALUE BTMFB |

FIG. 13

| TP | TOP MAX RT[°] | TOP MIN RT[°] | TOP MAX FB[mm] | TOP MIN FB[mm] | ... | BTM MAX RT[°] | BTM MIN RT[°] | BTM MAX FB[mm] | BTM MIN FB[mm] |
|---|---|---|---|---|---|---|---|---|---|
| ADJUSTABLE RANGE | TP VALUE MAXRT | TP VALUE MINRT | TP VALUE MAXFB | TP VALUE MINFB | ... | TP VALUE MAXRT | TP VALUE MINRT | TP VALUE MAXFB | TP VALUE MINFB |

FIG. 15

DIFFERENCE FROM AVERAGE OF Run

|  | DIFFERENCE FROM AVERAGE |
|---|---|
| POINT 1 | $\alpha 1$ |
| POINT 2 | $\alpha 2$ |
| . | . |
| . | . |
| POINT n | $\alpha n$ |

FIG. 16

CONSTRAINT CONDITION

|  | RT VALUE 1 | FB VALUE 1 | ... | FB VALUE m | FB VALUE m |
|---|---|---|---|---|---|
| PLUS MOVE-MENT AMOUNT (MAXIMUM) | MAXRT1 | MAXFB1 | ... | MAXRTm | MAXFBm |
| MINUS MOVE-MENT AMOUNT (MAXIMUM) | MINRT1 | MINFB1 | ... | MINRTm | MINFBm |

SUBSTRATE PROCESSING APPARATUS, INFORMATION PROCESSING APPARATUS, AND SUBSTRATE PROCESSING METHOD

CROSS-REFERENCE TO RELATED APPLICATIONS

This application is based on and claims priority from Japanese Patent Application No. 2019-132260 filed on Jul. 17, 2019 with the Japan Patent Office, the disclosure of which is incorporated herein in its entirety by reference.

TECHNICAL FIELD

The present disclosure relates to a substrate processing apparatus, an information processing apparatus, and a substrate processing method.

BACKGROUND

In a process of manufacturing a semiconductor device, a substrate is transferred into a predetermined chamber of various manufacturing apparatuses such as a film forming device, an etching device, and an inspection device, and a process is performed on the substrate according to each device. The substrate is carried into each manufacturing apparatus by a transfer arm having a fork or an end effector, and it is known in the related art that the substrate needs to be accurately disposed at a predetermined position in the chamber (see, e.g., Japanese Patent Laid-Open No. 2012-094814).

SUMMARY

A substrate processing apparatus according to an aspect of the present disclosure includes a substrate transfer device that transfers the plurality of substrates accommodated in a substrate transfer container to a substrate holder; a substrate holder transfer stage that introduces the substrate holder into a reaction container; a substrate transfer controller that obtains a film thickness measurement result of a film thickness meter as a processing result of at least one substrate, and determine a placing position of a substrate with respect to the substrate holder by a model created in advance from the film thickness measurement result and a transfer position setting unit, thereby performing an operation of the substrate transfer machine; an information processing unit that analyzes an eccentricity state from a film thickness variation state by an eccentricity state analysis unit when a film thickness measurement result is newly obtained; a learning function unit that updates the model from the analyzed eccentricity state; and an optimization function unit that updates the placing position of a substrate by the updated model and the transfer position setting unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 10A and 10B are views for explaining an example of a variation evaluation of a film thickness.

FIG. 11 is a view illustrating an example of a newly formed film formation result input to an eccentricity state analysis unit.

FIG. 12 is a view illustrating an example of a teaching position input to a learning function unit.

FIG. 13 is a view illustrating an example of a constraint condition input to an optimization function unit.

FIG. 15 is a view illustrating an example of "residual difference from an Edge average of a current Run" of an evaluation function J.

FIG. 16 is a view illustrating an example of a constraint condition.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, an embodiment for implementing the present disclosure will be described with reference to the drawings.

[Heat Treatment Apparatus]

Descriptions will be made on a heat treatment apparatus according to an embodiment of the present disclosure to which a program that eliminates eccentricity may be appropriately applied.

Figure 1:
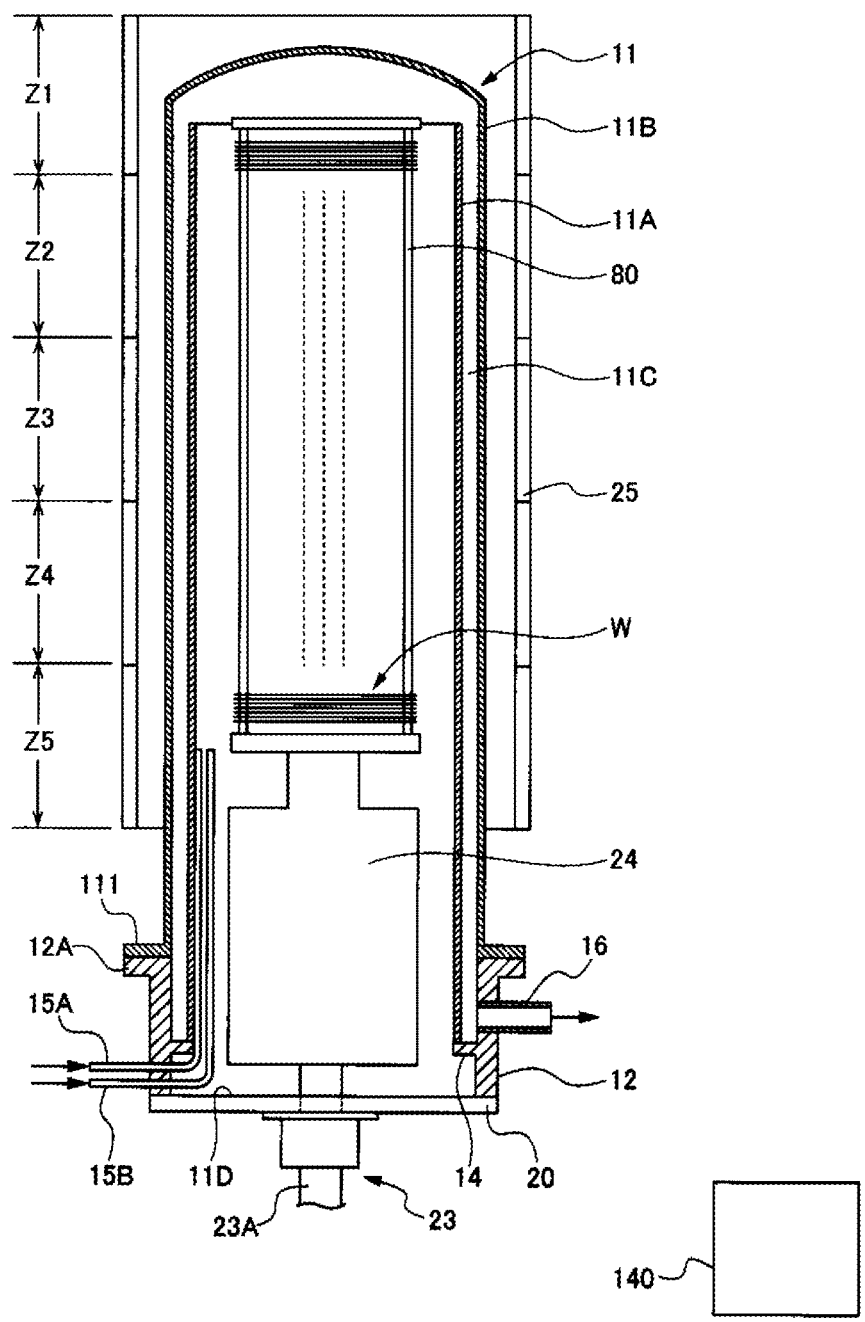
FIG. 1 is an explanatory cross-sectional view illustrating a schematic configuration of an example of a heat treatment apparatus.

FIG. 1 is an explanatory cross-sectional view illustrating a schematic configuration of an example of a heat treatment apparatus. The heat treatment apparatus is provided with a reaction container (a process tube) 11 having a double tube structure constituted by a straight tubular inner tube 11A that is disposed to extend in the height direction (the vertical direction in FIG. 1) and has an open upper end, and an outer tube 11B that is concentrically disposed at a predetermined interval around the inner tube 11A so as to form a cylindrical space 11C and has a closed upper end. The space below the reaction container 11 is a loading area in which, for example, a wafer W that is a target object is transferred to a wafer boat 80 serving as a target object holder (will be described later). Then, both the inner tube 11A and the outer tube 11B are made of a material having excellent heat resistance and corrosion resistance, for example, high-purity quartz glass.

A short cylindrical manifold 12 having a flange portion 12A at the upper end is provided in the lower end portion of the outer tube 11B of the reaction container 11. The flange portion 12A is joined with a lower end flange portion 111 provided in the lower end portion of the outer tube 11B via a sealing unit (not illustrated) such as an O-ring, such that the outer tube 11B of the reaction container 11 is in an air-tightly fixed state. The inner tube 11A of the reaction container 11 extends downward from the lower end surface of the outer tube 11B, and is supported by an annular inner tube support 14 provided on the inner surface of the manifold 12 while being inserted into the manifold 12.

In a vertical cross section of the reaction container 11 of the heat treatment apparatus, in one side wall of the manifold 12, a gas supply pipe 15A configured to introduce a processing gas into the reaction container 11 and a gas supply pipe 15B configured to introduce an inert gas into the reaction container 11 are provided to air-tightly penetrate the side wall of the manifold 12 and extend upward in the inner pipe 11A. A gas supply source (not illustrated) is connected to each of the gas supply pipes 15A and 15B.

Further, in the other side wall of the manifold 12, an exhaust pipe 16 configured to exhaust the inside of the reaction container 11 is provided to communicate with the cylindrical space 11c between the inner tube 11A and the outer tube 11B. An exhaust mechanism (not illustrated) having, for example, a vacuum pump and a pressure control mechanism is connected to the exhaust pipe 16, and thus, the inside of the reaction container 11 is controlled to a predetermined pressure.

A lifting mechanism (not illustrated) is provided on the lower side of the reaction container 11 and is driven in the vertical direction to carry in/out the wafer boat 80 to/from the reaction container 11. The lifting mechanism includes a disc-shaped cover 20 that opens/closes a lower end opening 11D of the reaction container 11. In the lower portion of the cover 20, a rotation driving unit 23 is provided in a state where a rotation driving shaft 23A thereof is air-tightly penetrate the cover 20, and the rotation driving shaft 23A is connected to a lower surface of a heat reserving cylinder (a heat insulating body) 24.

Figure 2:
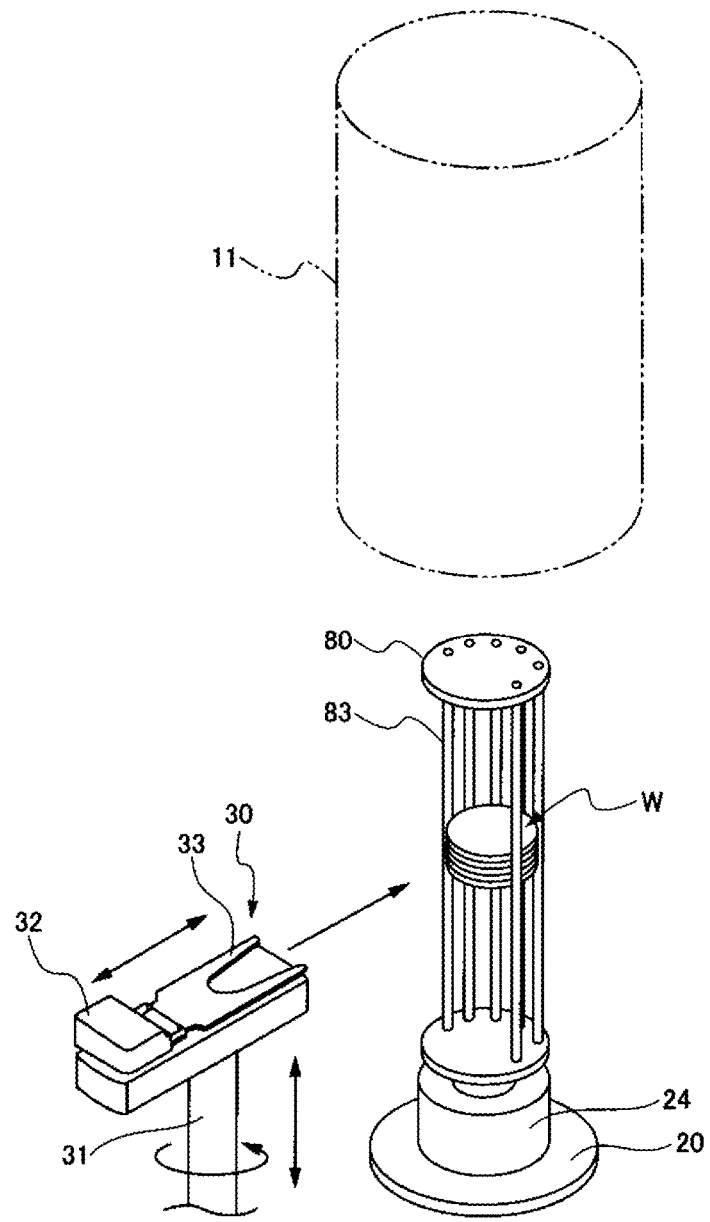
FIG. 2 is an explanatory perspective view illustrating an operation state of a transfer device of the heat treatment apparatus illustrated in FIG. 1 in relation to a wafer boat.

The wafer boat 80 is made of, for example, high-purity quartz glass. As illustrated in FIG. 2, in order to hold a plurality of, for example, about 100 to 150 disc-shaped wafers W horizontally, and vertically in multiple stages at a predetermined interval (pitch) in a range of, for example, 4 to 20 mm, target object holding portions such as target object holding grooves are formed on a column 83. The wafer W is transferred by a transfer device 30 in a state where the cover 20 is at the lowermost position.

The transfer device 30 is provided with an elongated rectangular transfer head 32 that is vertically moved and is provided rotatably around a rotation shaft 31 extending vertically. The transfer head 32 is provided with, for example, 1 to 5 thin plate fork-shaped support arms 33 so as to be movable forward and backward in the longitudinal direction of the transfer head 32. The operation state of the transfer device 30, specifically, the vertical operation and the rotational operation of the transfer head 32, and a forward/backward operation of the support arm 33 are controlled by a control device.

A cylindrical heater 25 serving as a heating unit configured to heat the wafer W accommodated in the reaction container 11 is provided outside the reaction container 11 so as to surround the periphery of the reaction container 11. The cylindrical heater 25 is provided with a cylindrical insulating material (not illustrated) in which a linear resistance heating element is disposed in a spiral manner or a meandering manner. The resistance heating element is connected to a control device configured to control the magnitude of the power to be supplied such that the wafer W becomes a preset temperature state.

For example, as illustrated in FIG. 1, the cylindrical heater 25 is divided into a plurality of, in the illustrated example, five heating regions (zones) Z1 to Z5 in the height direction in the reaction container 11. Each of the heating regions Z1 to Z5 is in a state where the temperature may be controlled independently, that is, a zone control is possible.

Here, an example of processing conditions in the film forming processing performed on the wafer W includes, for example, with respect to a wafer W having a wafer diameter of 300 mm, a processing temperature of 400 to 700° C. at which the wafer W is processed, and a pressure inside the reaction container 11 of 13 to 170 Pa (0.1 to 1.3 Torr).

As will be described in detail in the following, in the heat treatment apparatus having the above described configuration, the film forming processing is actually performed on the wafer W, and when the wafer on which a film is formed has low in-plane uniformity on the surface thereof, a transfer position optimization operation that optimizes the transfer position of the new wafer W with respect to the wafer boat 80 is performed, and then, the film forming processing is performed again on the new wafer W under the same processing conditions.

Specifically, first, the movement of the transfer head 32 in the vertical direction and in the rotating direction, and the forward/backward operation of the support arm 33 are performed in a controlled state, so that the wafer W is taken out from the accommodating container that is transferred by an appropriate transfer unit (not illustrated) and in which a plurality of wafers W is accommodated therein, and sequentially transferred to the wafer boat 80 waiting on the cover 20 in a state where the cover 20 is at the lowermost position. Here, in each of the target object holding portions of the wafer boat 80, the transfer position to which the wafer W is transferred is a position (hereinafter, a "set transfer position") where, for example, a shape center position of the wafer W coincides with a rotation center position of the wafer boat 80 rotationally driven by the rotation driving unit 23. Further, for example, a simulated semiconductor wafer (dummy wafer) is placed on the uppermost and the lowermost target object holding portions of the wafer boat 80.

Then, the cover 20 is driven upward by the lifting mechanism to carry the wafer boat 80 into the reaction container 11 from the lower end opening 11C, and the cover 20 air-tightly closes the lower end opening 11C of the reaction container 11. Thereafter, the exhaust unit is operated to reduce the pressure in the reaction container 11 to a predetermined pressure, and the cylindrical heater 25 is operated such that each of the heating regions Z1 to Z5 in the reaction container 11 is heated to a target temperature at which the wafer W is processed. In this state, an appropriate film forming gas is introduced into the reaction container 11 from the gas supply pipe 15A, and then, the film forming processing is performed on the wafer W. A controller 140 is an arithmetic processing unit configured to control the operation of the entire heat treatment apparatus, and may be configured by, for example, a computer.

Figure 3:
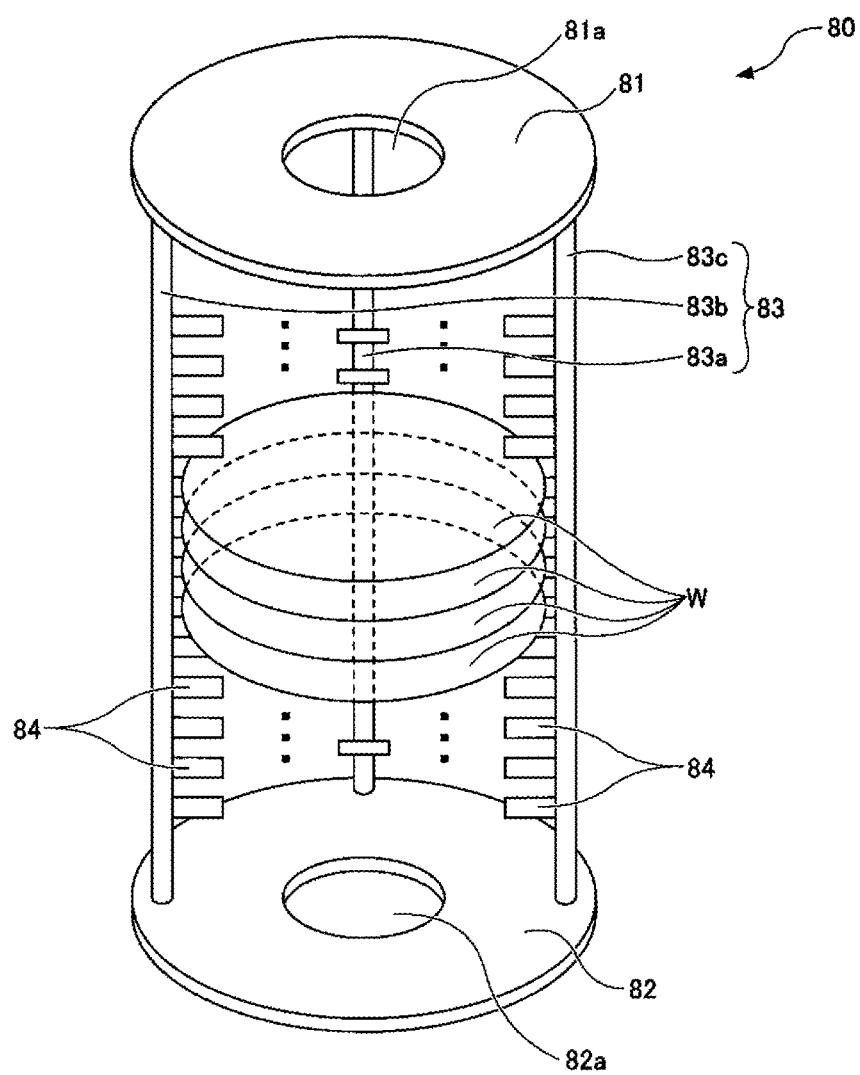
FIG. 3 is a view illustrating an example of a wafer boat that may be used in a heat treatment apparatus.

Next, descriptions will be mad on an example of the wafer boat 80 used in the heat treatment apparatus with reference to FIG. 3. FIG. 3 is a view illustrating an example of the wafer boat 80 that may be used in the heat treatment apparatus.

As illustrated in FIG. 3, the wafer boat 80 includes a top plate 81 and a bottom plate 82, and the column 83 between the top plate 81 and the bottom plate 82. FIG. 3 illustrates an example provided with three columns 83. The number of columns 83 may be variously set depending on the application as long as it is three or more, and for example, the number of columns may be four.

Each of the columns 83 has supports 84 formed with a predetermined interval in the vertical direction. Since the supports 84 have a small flat plate shape and protrude inward like a claw, they may be called a claw. The interval of the supports 84 may be appropriately set depending on the application, but as described above, for example, may be set as an interval such that 50 to 150 wafers W may be placed on one wafer boat 80. The supports 84 may have any shape as long as they are capable of supporting the wafer W, but, for example, may be formed in a rectangular shape having a horizontal plane extending in the central direction. The supports 84 of each of the columns 83 are set to have the same height as the supports 84 that support the same wafer W such that the wafer W is supported in the horizontal state. Further, when the number of columns 83 is three, one column 83a is disposed on the inner side of the center when viewed from the front side on which the wafer W is mounted, and the other two columns 83b and 83c are disposed symmetrically with respect to the column 83a.

The top plate 81 and the bottom plate 82 may be formed in an annular shape having an opening 81a and opening 82a in the center area, respectively. Further, the wafer boat 80 may include a reinforcing pillar as necessary, in addition to the column 83. The reinforcing pillar is a support pillar provided for reinforcement in order to increase the strength of the wafer boat 80, and does not have the support 84 that supports the wafer W. For example, one reinforcing pillar may be respectively provided between the column 83a on the inner side of the center and the column 83b on the left side, and between the column 83a on the inner side of the center and the column 83c on the right side. The wafer boat 80 may include quartz that is the same material as the wafer boat support, and may be made of various materials depending on the application.

In the heat treatment apparatus having the above described configuration, when performing the film formation, the wafer W is transferred on the wafer boat 80 placed on the cover 20 using the transfer device 30, and the cover 20 is moved up to be accommodated in the reaction container 11. Then, the exhaust unit is operated to reduce the pressure in the reaction container 11 to a predetermined pressure, and the cylindrical heater 25 is operated such that each of the heating regions Z1 to Z5 in the reaction container 11 is heated to a target temperature at which the wafer W is processed. In this state, an appropriate film forming gas is introduced into the reaction container 11 from the gas supply pipe 15A, and then, the film forming processing is performed on the wafer W.

Here, since the gas supply pipe 15A is provided outside the wafer W, the distance from the gas supply pipe 15A is different at positions in the plane of the wafer W, and the wafers W are stacked in the vertical direction, the adsorption amount of the processing gas on the wafer W may be different in the plane of the wafer W and also between the upper and lower sides. Further, there may be a slight difference in the plane of the wafer W and between the upper and lower sides with respect to exhausting in the same manner.

Due to the differences, when a film is formed on the wafer W, there may be a difference in the film thickness in the plane of the wafer W, including a difference in the vertical position of the wafer W. The film thickness of the thin film formed on the wafer W is desirable to be uniform in the plane of the wafer W, and the in-plane uniformity is desirable to be good. In the following, the deviation of the film thickness distribution in which the film thickness is not uniform in the plane (e.g., in the edge) of the wafer W due to the position of the wafer W placed on the wafer boat 80 is referred to as eccentricity. Eccentricity is required to be eliminated to maximize the process performance.

In the related art, eccentricity is improved by an operator by adjusting the position of the wafer W to be disposed on the wafer boat 80 based on experience and sense. However, there is no index of how much eccentricity needs to be improved, and the adjustment is made until the operator determines that the position is the optimum position through trial and error. As described above, the improvement of eccentricity is an operation depending on the skill of the operator, and thus, the time required for the improvement varies depending on the operator. In the embodiment, regardless of the operator, eccentricity may be simply eliminated in a short time by using a program (will be described later) that eliminates eccentricity.

The program that eliminates eccentricity according to the embodiment optimizes the placing position (teaching position) of the wafer W instructed to the transfer device 30 as described later. The transfer device 30 slightly moves the support arm 33 in the front-back direction and in the rotating direction in accordance with the instructed teaching position to place the wafer W on the support 84 in the wafer boat 80.

Figure 4:
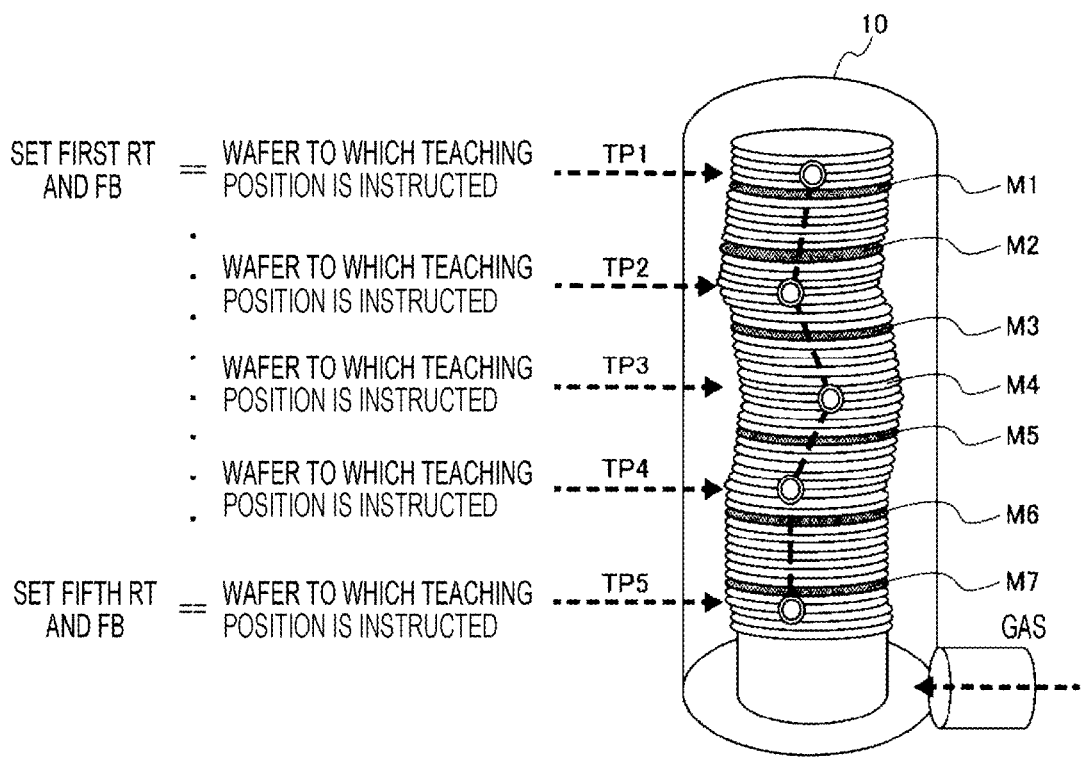
FIG. 4 is a view for explaining an example of a placing position of wafers W.

FIG. 4 is a view for explaining an example of the placing position of the wafers W. FIG. 4 illustrates an example in which teaching positions TP1 to TP5 are instructed at five set locations (five wafers W). Further, in FIG. 4, the wafer boat 80 is omitted, and an example of placement of the wafers W in the reaction container 11 is illustrated.

For example, when a plurality of wafers W is loaded and subjected to heat treatment in one batch, the teaching position indicated as a placing position is the center position of the wafers W positioned at a plurality of set locations in the vertical direction. The number of the set locations instructed as teaching positions is not particularly limited as long as it is plural, but is, for example, 2 to 5. For example, FIG. 4 illustrates an example in which the teaching positions are instructed to five wafers W among 56 wafers W that are stacked.

Further, the center position of the wafers W other than the wafers W to which the teaching position is instructed is linearly interpolated with the center position of the upper and lower wafers W to which the teaching position is instructed. The teaching position is instructed by the movement amount in the front-back direction and the movement amount in the rotating direction of the support arm 33 from the base position.

Therefore, the support arm 33 may be slightly moved in the front-back direction and in the rotating direction of the support arm 33 from the base position of the wafer boat 80 to dispose the wafer W on the support 84. As described above, in the embodiment, the position of the wafer W placed on the wafer boat 80 may be moved variously from the base position in accordance with the instruction of the teaching positions to the five set locations and the film forming processing may be performed.

Further, monitor wafers M1 to M7 that measures the film thickness are set in FIG. 4. Arbitrary numbers of monitor wafers M1 to M7 may be set in a section defined above and below the set locations instructed as the teaching positions TP1 to TP5.

FIG. 4 illustrates an example in which two monitor wafers M1 and M2, M3 and M4, and M6 and M7 are placed in three sections of the set location that instructs the teaching position TP1—the set location instructed as the teaching position TP2, the set location instructed as the teaching position TP2—the set location instructed as the teaching position TP3, and the set location instructed as the teaching position TP4—the set location instructed as the teaching position TP5, and further, one monitor wafer M5 is placed in one section of the set location instructed as the teaching position TP3—the set location instructed as the teaching position TP4.

The placement is merely an example. In a case of a smaller number, three wafers W may be set as the monitor wafers, and the number of wafers may be set depending on the application. Further, the set locations instructed as the teaching positions TP1 to TP5 and the monitor wafers M1 to M7 may or may not be identical. FIG. 4 illustrates an example in which all of the wafers W at the set locations instructed as the teaching positions TP1 to TP5 and the monitor wafers M1 to M7 are different.

Figure 5B:
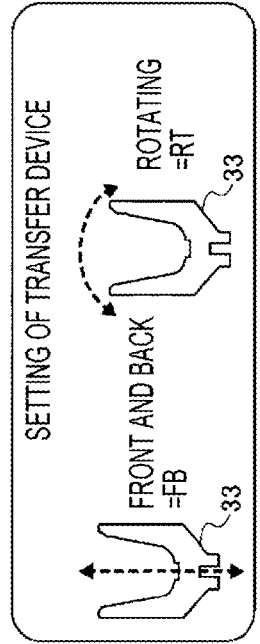
FIGS. 5A to 5C are views for explaining an example of a control target and a control parameter.
Figure 5C:
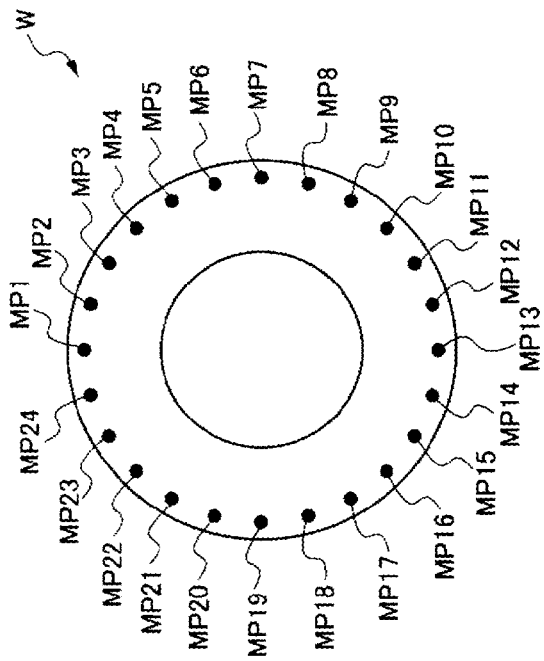
Figure 5A:
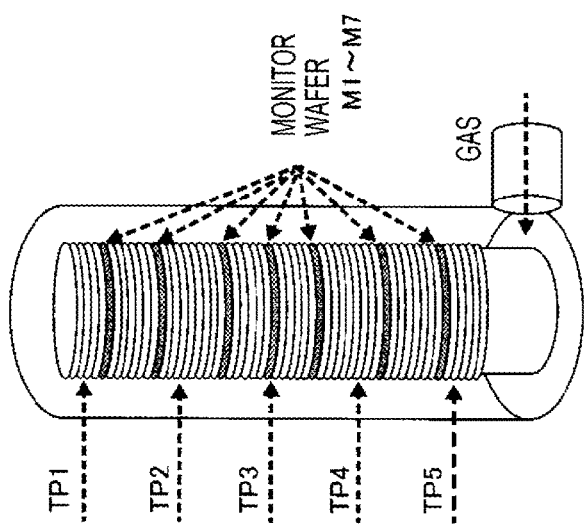

FIGS. 5A to 5C are views for explaining an example of a control target and a control parameter. FIG. 5A is a view illustrates an example of a positional relationship between the wafers W at the set locations instructed as the teaching positions TP1 to TP5 and the monitor wafers M1 to M7 in the vertical direction. Although FIG. 5A illustrates the same positional relationship as that of FIG. 4, all of the teaching positions TP1 to TP5 are instructed at the base position, and thus, all of the plurality of wafers W are placed at the same base position.

FIG. 5B is a view illustrating an example of a control parameter. Examples of the control parameter includes two settings of the front-back direction (hereinafter, may be abbreviated as "FB") and the rotating direction (hereinafter, may be abbreviated as "RT") of the support arm 33.

In the front-back direction, for example, an inward movement (positional movement) may be displayed as plus, a frontward movement may be displayed as minus. The rotating direction is instructed by the rotation angle of the support arm 33. For example, right rotation may be displayed as plus, and left rotation may be displayed as minus.

When assuming that, as the control parameter, there are two settings of FB and RT and two to five set locations instructed as the teaching position, at least four (=2×2) control conditions may be set and at most ten (=2×5) control conditions may be set. The control conditions that may be set may be referred to as a control knob. The number of control knobs indicates the number of control conditions that may be changed.

FIG. 5C is a view illustrating an example of monitor locations of a monitor wafer. The monitor locations MP may be set in arbitrary positions in the plane of the wafer W, but may be disposed along a circumferential direction in the area in the vicinity of the outer periphery of the wafer W. FIG. 5C illustrates an example in which 24 points of monitor locations MP1 to MP24 are placed.

In order to grasp the in-plane uniformity, it is effective to measure the film thickness balance at the edge of the wafer W. When setting the 24 points of monitor locations MP (film thickness measurement points), it is possible to set control targets as many as the number of monitor wafers. For example, as illustrated in FIG. 5A, when seven wafers W are set as the monitor wafers M1 to M7, 168 (=24 points×7 wafers) control targets may be set.

Further, when 13 monitor wafers M1 to M13 are set, 312 (=24 points×13 wafers) control targets may be set. The reason why called as a "control target" is because the purpose of the film thickness control that increases the in-plane uniformity may be achieved by controlling the film thickness variation at the monitor locations MP to be small.

[Information Processing System in which Program that Eliminates Eccentricity is Executed]

Figure 6:
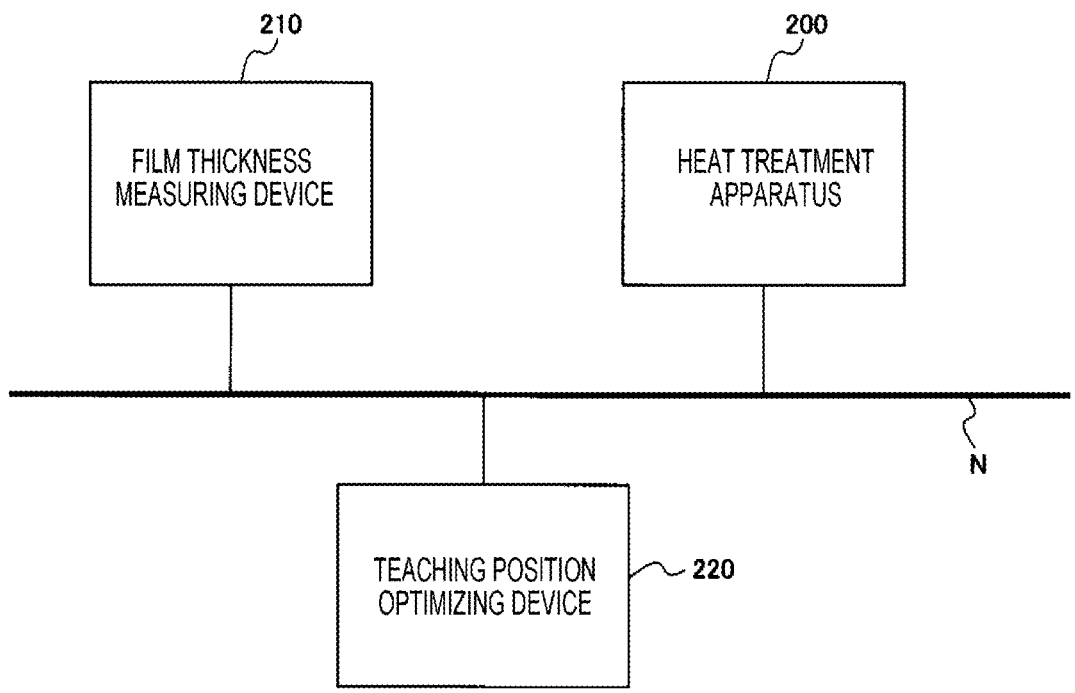
FIG. 6 is a configuration view of an example of an information processing system according to the present embodiment.

FIG. 6 is a configuration view of an example of an information processing system according to the present embodiment. In the information processing system illustrated in FIG. 6, a heat treatment apparatus 200, a film thickness measuring device 210, and a teaching position optimizing device 220 are connected with each other via a communication network N such as the Internet or LAN so that data communication is possible. The information processing system in FIG. 6 is an example, and data may be moved via a storage medium such as a USB instead of the network N.

As described with reference to FIGS. 1 to 5C, the heat treatment apparatus 200 transfers the wafer W onto the wafer boat 80 by the transfer device 30, accommodates the wafer boat 80 on which the wafer W is placed into the reaction container 11, and performs the film formation on the wafer W. Further, the teaching position instructed to the transfer device 30 so as to transfer the wafer W on which a film is formed onto the wafer boat 80 is input to the teaching position optimizing device 220 automatically or in accordance with an operation of an operator.

The film thickness measuring device 210 measures the film thicknesses of the monitor locations MP1 to MP24 of the monitor wafers M1 to M7 in FIG. 5C, among the wafers W on which a film is formed by the heat treatment apparatus 200. The measurement result of the film thicknesses of the monitor locations MP1 to MP24 of the monitor wafers M1 to M7 by the film thickness measuring device 210 is input to the teaching position optimizing device 220 automatically or in accordance with an operation of an operator.

The teaching position optimizing device 220 is an information processing device in which the program that eliminates eccentricity according to the embodiment is executed. The teaching position optimizing device 220 calculates a teaching position that is expected to minimize the influence of eccentricity as described later using a model (will be described later) created in advance, the input measurement result of the film thickness, and the input teaching position.

The teaching position optimizing device 220 may indicate the calculated teaching position that is expected to minimize the influence of eccentricity, and the degree of the improvement of the eccentricity when a film is formed using the teaching position, to the operator by a display. The information processing system in FIG. 6 is an example, and the heat processing apparatus 200 and the teaching position optimizing device 220 may be integrated. Further, an information processing system in which the teaching position optimizing device 220 is functionally divided into a plurality of devices may be used.

[Hardware Configuration]

Figure 7:
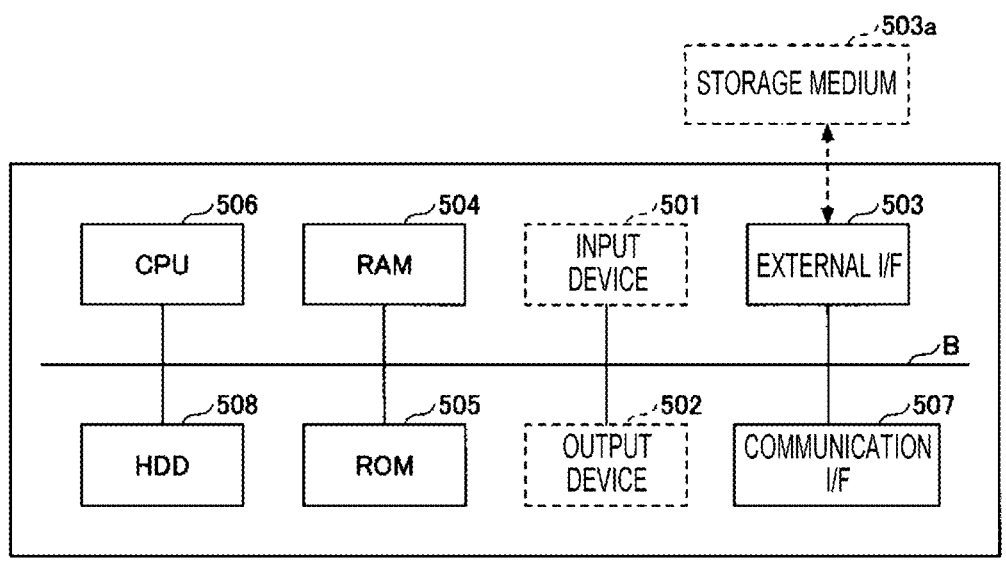
FIG. 7 is a hardware configuration view of an example of a computer according to the present embodiment.

The teaching position optimizing device 220 in FIG. 6 is implemented by, for example, a computer having a hardware configuration illustrated in FIG. 7. FIG. 7 is a hardware configuration view of an example of a computer according to the embodiment.

The computer in FIG. 7 includes, for example, an input device 501, an output device 502, an external I/F 503, a RAM 504, a ROM 505, a CPU 506, a communication I/F 507, and a HDD 508, which are connected with each other via a bus B. The input device 501 and the output device 502 may connected to use when necessary.

The input device 501 may be, for example, a touch panel used for input, operation keys or buttons, a keyboard, and a mouse. The output device 502 is constituted by, for example, a display such as a liquid crystal or an organic EL that displays a screen and a speaker that outputs sound data such as voice or music. The communication I/F 507 is an interface that connects the computer to the communication network N. The HDD 508 is an example of a non-volatile storage device that stores a program or data. A drive device (e.g., a solid state drive (SSD)) that uses a flash memory may be used instead of the HDD 508.

The external I/F 503 is an interface with an external device. The external device includes, for example, a storage medium 503a. Therefore, the computer may read out and/or write to the storage medium 503a via the external I/F 503. The storage medium 503a includes, for example, a flexible disk, a CD, a DVD, a SD memory card, and a USB memory.

The ROM 505 is an example of a non-volatile semiconductor memory (a storage device) capable of retaining a program or data even when the power is turned off. The RAM 504 is an example of a volatile semiconductor memory (a storage device) that temporarily retains a program or data. The CPU 506 is an arithmetic device that reads out a program or data from the storage device such as the ROM 505 or the HDD 508 onto the RAM 504 and executes a processing so as to implement control or functions of the entire computer. The teaching position optimizing device 220 according to the embodiment may implement various processings illustrated in the embodiment, for example, by executing the program that eliminates the eccentricity according to the embodiment in the computer having the hardware configuration.

The hardware configuration of the computer in FIG. 7 is an example, and may be, for example, a smart phone, a tablet terminal, or a distributed processing system including a plurality of computers.

[Functional Block]

Figure 8:
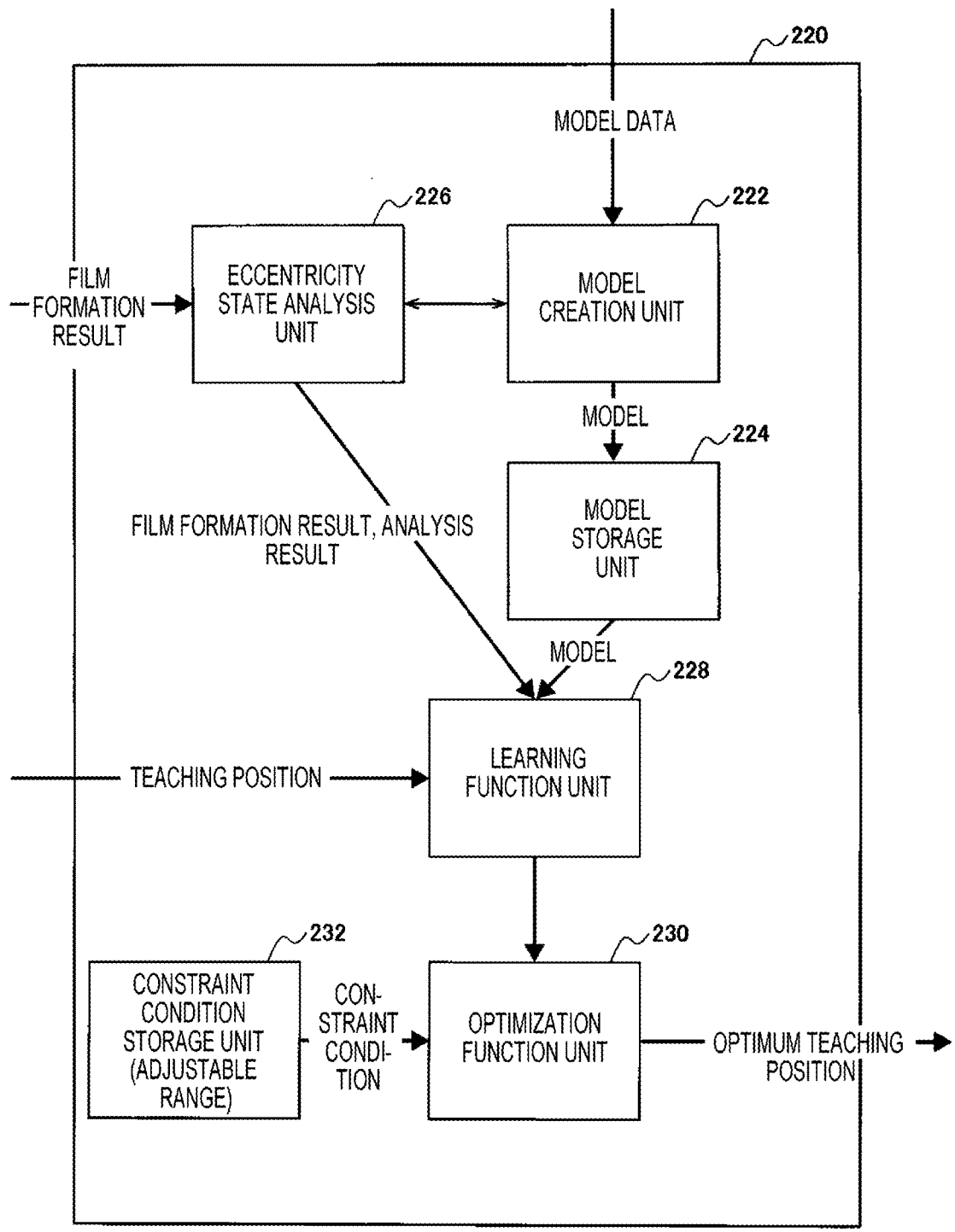
FIG. 8 is a functional block diagram of an example of a teaching position optimizing device according to the present embodiment.

Next, descriptions will be made on functional blocks of the teaching position optimizing device 220 according to the embodiment. FIG. 8 is a functional block diagram of an example of the teaching position optimizing device according to the embodiment. The teaching position optimizing device 220 executes the program that eliminates the eccentricity according to the embodiment so as to implement a model creation unit 222, a model storage unit 224, an eccentricity state analysis unit 226, a learning function unit 228, an optimization function unit 230, and a constraint condition storage unit 232.

The model creation unit 222 receives the results (results of a plurality of Runs) of film formation in advance using a plurality of control knobs as a model data. The model data includes the film thicknesses of the monitor locations MP1 to MP24 of the monitor wafer for each Run and the teaching position. The model creation unit 222 creates a model using the model data. The created model illustrates how the eccentricity state is changed due to changes in the teaching position in a mathematical expression. The model storage unit 224 stores the model.

The eccentricity state analysis unit 226 receives a newly formed film formation result. The film formation result includes the measurement result of the film thicknesses of the monitor locations MP1 to MP24 of the monitor wafer. The eccentricity state analysis unit 226 analyzes the eccentricity state by performing a variation evaluation of the input film thicknesses of the monitor locations MP1 to MP24.

The learning function unit 228 provides a learning function. The learning function unit 228 receives the film formation result and the analysis result input from the eccentricity state analysis unit 226, the teaching position corresponding to the film formation result and the analysis result, and the model stored in the model storage unit 224, and learns. More specifically, the learning function unit 228 uses the film formation result and the analysis result input from the eccentricity state analysis unit 226 and the teaching position corresponding to the film formation result and the analysis result to confirm whether there is an error in the model stored in the model storage unit 224. When there is an error, the learning function unit 228 corrects the model.

The constraint condition storage unit 232 stores an adjustable range of the teaching position as a constraint condition. When the model corrected by the learning function unit 228 and the constraint condition are input, the optimization function unit 230 performs optimization calculation and calculates an optimum teaching position where the influence of the eccentricity is predicted to be reduced most. The optimization function unit 230 outputs the calculated optimum teaching position.

Further, when outputting the calculated optimum teaching position, the teaching position optimizing device 220 uses the teaching position to display the degree (improvement amount) of the improvement of the eccentricity when a film is formed in a diagram or a table. Therefore, the operator may confirm the improvement amount of the eccentricity, and then determine whether to use the current teaching position as it is or to use the newly calculated optimum teaching position.

[Processing]

Hereinafter, descriptions will be made on a processing of the teaching position optimizing device 220 according to the embodiment.

Figure 9:
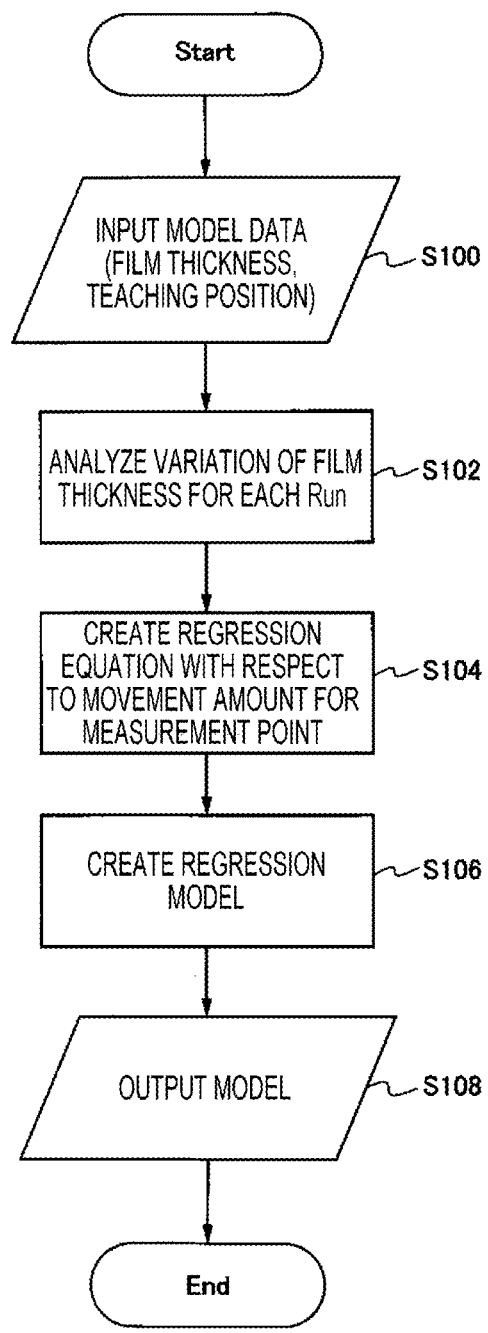
FIG. 9 is a flow chart of an example of a creating processing of a model according to the present embodiment.

FIG. 9 is a flow chart of an example of a creating processing of a model according to the embodiment. In step S100, the model creation unit 222 receives the result of the plurality of times of Runs as model data. The model data includes the film thicknesses of the monitor locations MP1 to MP24 of the monitor wafer for each Run and the teaching position.

In step S102, the model creation unit 222 causes the eccentricity state analysis unit 226 to analyze the variation evaluation of the film thickness for each Run. FIGS. 10A and 10B are views for explaining an example of the variation evaluation of the film thickness. The variation evaluation of the film thickness is performed by obtaining the average of the film thicknesses of the monitor locations MP1 to MP24 of the monitor wafer, and handling the variation of the film thicknesses of the monitor locations MP1 to MP24 as a ratio to the average. By handling as described above, even when the overall average film thickness is changed due to changes in the control conditions such as the film forming temperature and the film forming time, the variation of the film thickness may be evaluated with the same reference.

In step S104, the model creation unit 222 creates a regression equation of the evaluation value of the variation of the film thickness with respect to the movement amount from the base position for the respect measurement points that are the monitor locations MP1 to MP24.

In step S106, the model creation unit 222 creates a regression model using the created regression equation. In step S108, the model creation unit 222 outputs the created model.

(Running)

The eccentricity state analysis unit 226 receives, for example, the newly formed film formation result as illustrated in FIG. 11. FIG. 11 is a view illustrating an example of the newly formed film formation result input to the eccentricity state analysis unit. In FIG. 11, the monitor locations MP1 to MP24 are indicated by measurement point numbers "1" to "24." Further, FIG. 11 illustrates an example in which five wafers W are the monitor wafers. The film thicknesses of the monitor locations MP1 to MP24 for each monitor wafer are input to the eccentricity state analysis unit 226.

The learning function unit 228 receives, for example, the teaching position illustrated in FIG. 12. FIG. 12 is a view illustrating an example of the teaching position input to the learning function unit. Further, the optimization function unit 230 receives, for example, the adjustable range of the teaching position illustrated in FIG. 13 as a constraint condition. FIG. 13 is a view illustrating an example of the constraint condition input to the optimization function unit.

Figure 14:
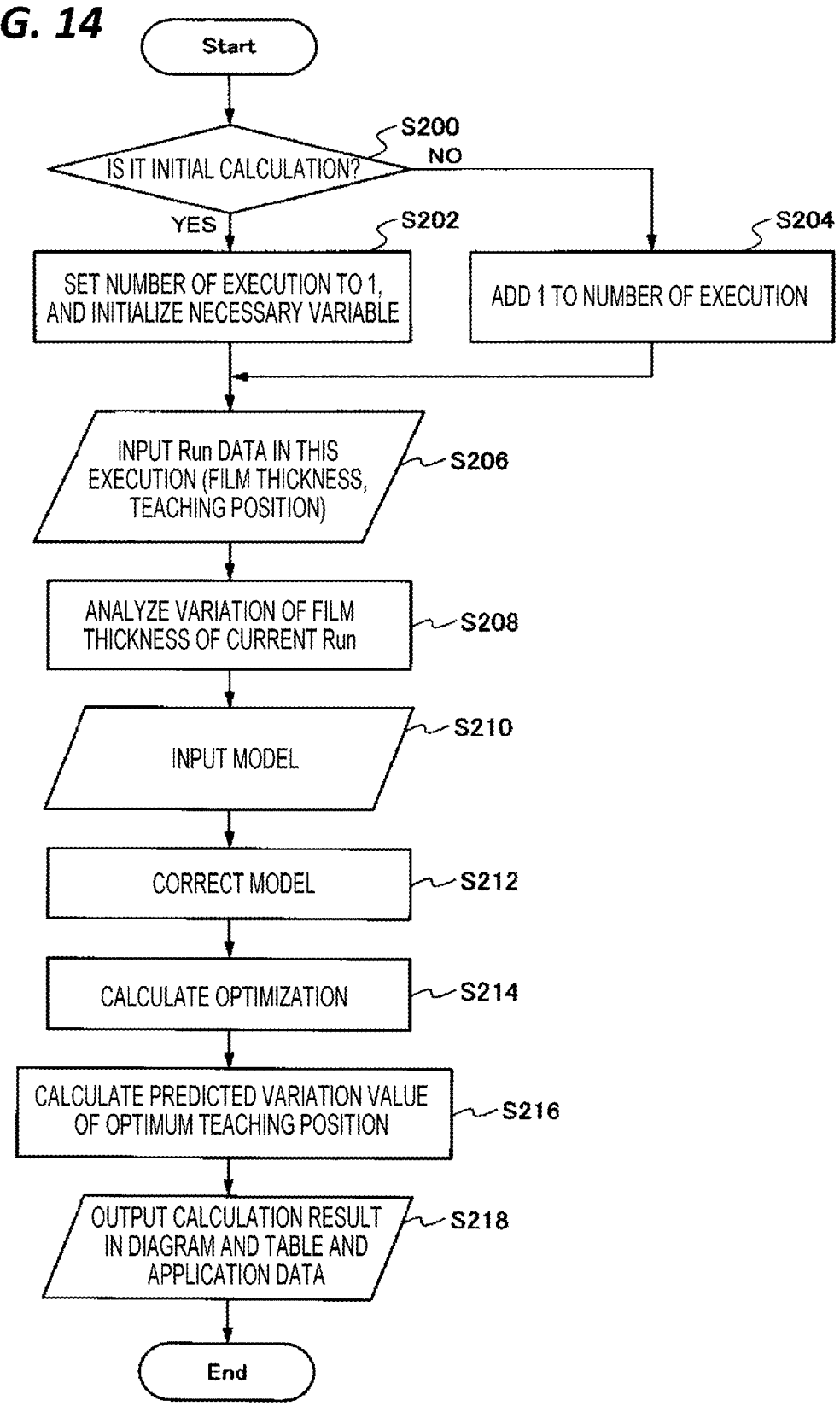
FIG. 14 is a flow chart of an example of a running of the teaching position optimizing device according to the present embodiment.

The teaching position optimizing device 220 according to the embodiment is ran as in FIG. 14 using the created model, the newly formed film formation result in FIG. 11, the teaching position in FIG. 12, and the constraint condition in FIG. 13. FIG. 14 is a flow chart of an example of a running of the teaching position optimizing device according to the embodiment.

In step S200, the teaching position optimizing device 220 confirms whether it is an initial calculation. When it is the initial calculation, the processing proceeds to step S202, and the teaching position optimizing device 220 sets the number of executions to "1" and initializes necessary variables, and then, performs the processing of step S206. When it is not the initial calculation, the teaching position optimizing device 220 proceeds to step S204, and add "1" to the number of executions, and then performs the processing of step S206.

In step S206, the eccentricity state analysis unit 226 receives, for example, the newly formed film formation result as illustrated in FIG. 11. The processing proceeds to step S208, and the eccentricity state analysis unit 226, for example, as illustrated in FIGS. 10A and 10B, evaluates the variation of the film thickness of the current Run from the newly formed film formation result. The processing proceeds to step S210, and the learning function unit 228 receives the model stored in the model storage unit 224.

The processing proceeds to step S212, and the learning function unit 228 uses the film formation result and the analysis result input from the eccentricity state analysis unit 226, the teaching position corresponding to the film formation result and the analysis result, and the model input in step S210 to confirm whether there is an error in the model stored in the model storage unit 224. When there is an error, the learning function unit 228 corrects the model.

The processing proceeds to step S214, and when the model corrected by the learning function unit 228 and the constraint condition are input, the optimization function unit 230 creates an evaluation function J in the following, and performs optimization calculation to find a combination that minimizes the evaluation function J.

$$\text{Evaluation Function } J=f \text{ (residual difference from an Edge average of a current Run, model RT,FB VS Unevenness of Each Point, movement change amount)} \qquad \text{[Equation 1]}$$

The "residual difference from an Edge average of a current Run" of the evaluation function J is the residual difference between the average film thickness of the current Run and the fill thickness of the monitor locations MP1 to MP24. The "model" of the evaluation function J is the model stored in the model storage unit 224. Further, the "movement change amount" of the evaluation function J represents the RT movement amount and the FB movement amount set in the next Run. FIG. 15 is a view illustrating an example of the "residual difference from the Edge average of the current Run" of the evaluation function J.

Further, in the optimization calculation in step S214, for example, a combination that minimizes the evaluation function J is found in the range that satisfies the constraint condition illustrated in FIG. 16. FIG. 16 is a view illustrating an example of the constraint condition. The optimization function unit 230 finds the combination that minimizes the evaluation function J, and outputs the movement change amount in the combination as the optimum teaching position.

As described above, the optimization function unit 230 performs the optimization calculation, and calculates the optimum teaching position where the influence of the eccentricity is predicted to be reduced most. The processing proceeds to step S216, and the optimization function unit 230 predicts the variation state of the film thickness when a film is formed using the calculated optimum teaching position.

Figure 17:
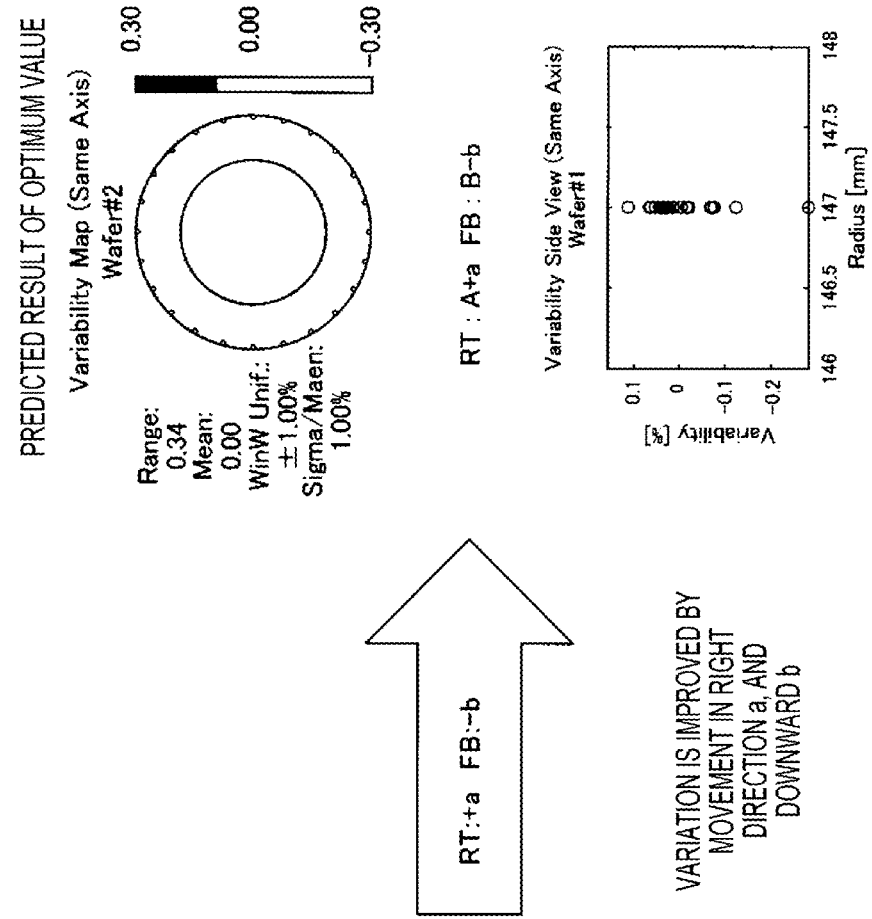
FIG. 17 is a view illustrating a display example of an optimum teaching position, and a prediction result of a film thickness variation state when forming a film using the optimum teaching position.

The processing proceeds to step S218, and the optimizing device 220 may display the optimum teaching position, and the predicted result of the variation state of the film thickness when a film is formed using the optimum teaching position, for example, in a diagram or a table as illustrated in FIG. 17, or may output in a data format of a spreadsheet application.

As described above, according to the embodiment, without depending on the skill of the operator, it is possible to reduce the time required to improve the eccentricity, to reduce the maintenance time of the heat treatment apparatus 200, and improve the operating rate of the heat treatment apparatus 200 and reduce the number of processings. Further, it is possible to maximize the process performance of the heat treatment apparatus 200.

The transfer device 30 is an example of a substrate transfer device. The wafer boat 80 is an example of a substrate holder. The heat treatment apparatus 200 is an example of a substrate processing apparatus. The controller 140 is an example of a substrate transfer controller.

According to the present disclosure, it is possible to optimize the placing position of the substrate instructed to the substrate transfer device so as to reduce the variation of the film thickness formed onto the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An information processing system comprising:
   a heat treatment apparatus, a film thickness measuring device, a teaching position optimizing device, wherein:

the heat treatment apparatus comprising:

a substrate transfer device including an arm configured to transfer a plurality of substrates accommodated in a substrate transfer container to a substrate holder;

a substrate holder transfer stage configured to introduce the substrate holder into a reaction container;

wherein the substrate holder holds a plurality of substrates in a vertical direction with a space between the substrates and specifies transfer positions of at least three or more substrates separated in the vertical direction, and the transfer position setting circuit sets a position where the placing position of the substrate that is not specified is linearly interpolated, wherein:

the film thickness measuring device measures a film thickness of monitor locations of plurality of monitor wafers among the plurality of substrates on which a film is formed by the heat treatment apparatus;

a substrate transfer controller configured to obtain the film thickness measurement result of a film thickness measuring device as a processing result of at least one substrate, and determine a placing position of the substrate with respect to the substrate holder by a model created in advance from the film thickness measurement result and a transfer position setting circuit, thereby performing an operation of the substrate transfer device;

wherein:

the teaching position optimizing device comprising;

an information processing circuit including an eccentricity state analysis circuit configured to analyze an eccentricity state from a film thickness variation state when a film thickness measurement result is newly obtained;

a learning function circuit configured to update the model from the eccentricity state analyzed by the eccentricity state analysis circuit of the information processing circuit; and an optimization function circuit configured to update the placing position of the substrate by an updated model and the transfer position setting circuit; and wherein an updated placing position of the substrate transfer device is instructed by a movement amount in a front-back direction and a movement amount in a rotating direction of the substrate transfer device.

2. The information processing system according to claim 1, further comprising:

a constraint condition storage configured to store a setting range of the placing position of the substrate transfer device set by the transfer position setting circuit.

3. The information processing system according to claim 2, wherein the eccentricity state analysis circuit calculates from a difference between a variation of the film thickness measurement result of at least a plurality of peripheral edges of the substrate and an average film thickness.

4. The information processing system according to claim 3, wherein the transfer position setting circuit instructs a center position of a substrate.

5. The information processing system according to claim 3, wherein the transfer position setting circuit instructs a substrate support of the substrate holder.

* * * * *